US010417981B2

(12) United States Patent
Wang et al.

(10) Patent No.: US 10,417,981 B2
(45) Date of Patent: Sep. 17, 2019

(54) GOA GATE DRIVING CIRCUIT AND LIQUID CRYSTAL DISPLAY

(71) Applicant: Shenzhen China Star Optoelectronics Technology Co., Ltd., Shenzhen, Guangdong (CN)

(72) Inventors: Tianhong Wang, Guangdong (CN); Xujun Liu, Guangdong (CN); Yi-fang Chou, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 192 days.

(21) Appl. No.: 15/504,335

(22) PCT Filed: Jan. 17, 2017

(86) PCT No.: PCT/CN2017/071444
§ 371 (c)(1),
(2) Date: Feb. 16, 2017

(87) PCT Pub. No.: WO2018/120336
PCT Pub. Date: Jul. 5, 2018

(65) Prior Publication Data
US 2018/0226035 A1 Aug. 9, 2018

(30) Foreign Application Priority Data
Dec. 30, 2016 (CN) .......................... 2016 1 1265265

(51) Int. Cl.
*G11C 19/00* (2006.01)
*G09G 3/36* (2006.01)
(Continued)

(52) U.S. Cl.
CPC ........... *G09G 3/3648* (2013.01); *G02F 1/136* (2013.01); *G06F 1/04* (2013.01); *G09G 3/3225* (2013.01);
(Continued)

(58) Field of Classification Search
None
See application file for complete search history.

(56) References Cited

U.S. PATENT DOCUMENTS

2008/0101529 A1* 5/2008 Tobita ................. G09G 3/3677
377/64
2008/0191980 A1* 8/2008 Jeon ..................... G09G 3/3677
345/87
(Continued)

FOREIGN PATENT DOCUMENTS

| CN | 103988252 A | 8/2014 |
|---|---|---|
| CN | 105206243 A | 12/2015 |

(Continued)

*Primary Examiner* — Tuan T Lam
(74) *Attorney, Agent, or Firm* — Andrew C. Cheng

(57) ABSTRACT

The present disclosure discloses a GOA gate driving circuit includes a plurality of GOA driving units arranged in cascade, each level GOA driving unit includes a pull-up control part, a pull-up part, a first pull-down part and a pull-down holding part; wherein, each stage GOA driving unit further includes a second pull-down part coupled between the gate control signal and the reference low level signal, the second pull-down part being controlled by a pull-down signal for lowering the gate control signal to the reference low level signal; the phase of the pull-down signal lags behind the latter two-stage scan driving signal, and the pull-down signal is provided by a separate control chip. The present disclosure further discloses a liquid crystal display including a GOA gate driving circuit as described above.

16 Claims, 3 Drawing Sheets

(51) Int. Cl.
  *G02F 1/136* (2006.01)
  *G09G 3/3225* (2016.01)
  *H03K 17/687* (2006.01)
  *G06F 1/04* (2006.01)
  *G09G 3/3266* (2016.01)
  *G11C 19/28* (2006.01)

(52) U.S. Cl.
  CPC ......... *G09G 3/3266* (2013.01); *G09G 3/3677* (2013.01); *G09G 3/3696* (2013.01); *H03K 17/6871* (2013.01); *G09G 2300/0408* (2013.01); *G09G 2310/0264* (2013.01); *G09G 2310/0278* (2013.01); *G09G 2310/0286* (2013.01); *G11C 19/28* (2013.01)

(56) References Cited

U.S. PATENT DOCUMENTS

| | | | | |
|---|---|---|---|---|
| 2010/0260312 A1* | 10/2010 | Tsai | .................... | G09G 3/3677 377/79 |
| 2012/0140871 A1* | 6/2012 | Yang | .................... | G09G 3/20 377/79 |
| 2012/0169703 A1* | 7/2012 | Yang | .................... | G11C 19/184 345/212 |
| 2014/0037043 A1* | 2/2014 | Yoon | .................... | G11C 19/00 377/64 |
| 2015/0279289 A1* | 10/2015 | Yu | .................... | G11C 19/28 345/690 |
| 2015/0318051 A1* | 11/2015 | Hong | .................... | G11C 19/28 377/68 |
| 2016/0155409 A1* | 6/2016 | Jeoung | .................... | G09G 5/003 345/214 |
| 2016/0155422 A1* | 6/2016 | Sun | .................... | G09G 3/20 345/213 |
| 2016/0240159 A1* | 8/2016 | Ohkawa | .................... | G11C 19/28 |
| 2016/0314737 A1* | 10/2016 | Park | .................... | G09G 3/3677 |
| 2016/0343335 A1* | 11/2016 | Cao | .................... | G09G 3/36 |
| 2017/0193937 A1* | 7/2017 | Du | .................... | G09G 3/3648 |
| 2018/0061347 A1* | 3/2018 | Zhang | .................... | G09G 3/3677 |

FOREIGN PATENT DOCUMENTS

| | | |
|---|---|---|
| CN | 105719590 A | 6/2016 |
| CN | 105869593 A | 8/2016 |
| CN | 106205528 A | 12/2016 |
| CN | 106228942 A | 12/2016 |
| KR | 20140093547 A | 7/2014 |

* cited by examiner

GOA GATE DRIVING CIRCUIT AND LIQUID CRYSTAL DISPLAY

FIELD OF THE DISCLOSURE

The present disclosure relates to a display technology field, and more particularly to a GOA gate driving circuit and a liquid crystal display.

BACKGROUND OF THE DISCLOSURE

In the active liquid crystal display device, each pixel has a thin film transistor (TFT) whose gate is connected to the horizontal scanning line, the drain is connected to the data line in the vertical direction, and the source is connected to the pixel electrode. Applying a sufficient voltage across the horizontal scan line will cause all the TFTs on that line to be turned on, the pixel electrode on the horizontal scanning line is connected with the data line in the vertical direction so as to write the display signal voltage on the data line into the pixel and control the light transmittance of the different liquid crystal so as to achieve the effect of controlling the color. Currently active LCD panel horizontal scan line driven mainly by the panel to complete the external IC, the external IC can control the level of the scan line at all levels of charge and discharge. The GOA technology can use the original LCD panel manufacturing process will be horizontal scan line driver circuit in the display area around the substrate, so that it can replace the external IC to complete the horizontal scan line driver. The GOA technology can reduce the bonding process of the external IC, have the opportunity to enhance productivity and reduce product cost, and can make the liquid crystal display panel is more suitable for the production of narrow border or borderless display products.

Conventional GOA gate driving circuits typically include a plurality of GOA driving units cascaded, with each stage of the GOA driving unit corresponding to driving a horizontal scan line. As shown in FIG. 1, the main structure of an existing GOA driving unit includes a pull-up control part 10, a pull-up part 20, a key pull-down part 30 and a pull-down holding part 40, and a capacitor boast CB responsible for potential uplift. Take the GOA circuit of 4 CK input signals as an example, for the nth-level GOA unit, the pull-up control part 10 is responsible for controlling the opening time of the pull-up part 20, generally according to the scan driving signal $G_{n-2}$ passed by the first two stages GOA driving unit, outputs the gate control signal $Q_n$ (commonly referred to as Q-point); the pull-up part 20 is controlled by the gate control signal $Q_n$ and is mainly responsible for outputting the clock signal CK as the scan driving signal $G_n$ of the local level circuit; the key pull-down part 30 is responsible for pulling down the gate control signal $Q_n$ and the scanning driving signal $G_n$ to the low level at the first time, i.e., when receiving the scan driving signal $G_{n+2}$ of the high level passed by the latter two stages GOA circuit unit, lowering the gate control signal $Q_n$ and scan driving signal $G_n$ of the local level circuit to a low level turns off the sweep signal first; the pull-down holding part 40 is responsible for holding the gate control signal $Q_n$ and scan driving signal $G_n$ of the local level circuit in the close state (i.e., low level potential); the C boast is responsible for the Q point of the second lift, so conducive to the output of the scan driving signal $G_n$ of the pull-up part 20.

Splicing screen technology, refers to the larger size of the LCD screen is cut into smaller size display, and then a number of smaller size display spliced to obtain a specific size of the display. With the development of the splicing screen technology, when the larger size of the liquid crystal display screen, set at the edge of the LCD screen of the GOA gate driving circuit of the proposed series of arbitrary cutting requirements. However, as described above, the conventional GOA gate driving circuit is controlled by the scan driving signal $G_{n+2}$, which is transmitted from the GOA circuit unit of the latter two stages, for the GOA circuit unit of each stage, if an arbitrary cut is made, for example, cutting at the n-th stage, in which the n-th stage is the last-stage circuit cell, the signal $G_{n+2}$ is no longer provided after the completion of the cutting to control the n-th level key pull-down part 30, leading to the level GOA circuit unit does not work, and even lead to the complete failure of the GOA gate driving circuit. Therefore, the current liquid crystal display, in which the GOA gate driving circuit is unable to meet the requirements of cutting in any number of stages.

SUMMARY OF THE DISCLOSURE

In view of the above, the present disclosure provides a GOA gate driving circuit which can be cut at any number of stages of GOA driving units so as to satisfy normal operation of each gate driving circuit formed after dicing.

In order to achieve the above object, the present disclosure adopts the following technical scheme:

A GOA gate driving circuit includes a plurality of GOA driving units arranged in cascade, each level GOA driving unit includes a pull-up control part, a pull-up part, a first pull-down part and a pull-down holding part; the pull-up control part controls the generation of a gate control signal according to a first two-stage scan driving signal; the pull-up part is controlled by the gate control signal, and converts the received scan clock signal into output of the local level scan driving signal; the first pull-down part controls to lower the gate control signal and the local-level scan driving signal to a reference low level signal according to the latter two-stage scan driving signal; the pull-down holding part is coupled between the gate control signal and the local level scan driving signal and the reference low level signal for lowing the gate control signal and the local level scan driving signal to the reference low level signal; wherein, each stage GOA driving unit further includes a second pull-down part coupled between the gate control signal and the reference low level signal, the second pull-down part being controlled by a pull-down signal for lowering the gate control signal to the reference low level signal; the phase of the pull-down signal lags behind the latter two-stage scan driving signal, and the pull-down signal is provided by a separate control chip.

Wherein, the waveform of the pull-down signal is a signal which is the same as the waveform of the latter two-stage scan driving signal and has a phase lag.

Wherein, the second pull-down part includes a third pull-down transistor having a source connected to the gate control signal, a gate connected to the pull-down signal, and a drain connected to a reference low level signal.

Wherein, the independent control chip is a timing control chip.

Wherein, the GOA driving unit further includes a capacitor boast connected between an output of the pull-up control part and an output of the pull-up part.

Wherein, the pull-up control part includes a pull-up control transistor, the source of the pull-up control transistor receives a reference high level signal, the gate receives the first two-stage scan driving signal and the drain outputs the gate control signal.

Wherein, the pull-up part includes a pull-up level transfer transistor, the gate of the pull-up level transfer transistor receives the gate control signal, the source connects to the scan clock signal, and the drain outputs the local level scan driving signal.

Wherein, the first pull-down part includes a first pull-down transistor and a second pull-down transistor, the source of the first pull-down transistor connects to the local level scan driving signal, the gate receives the latter two-stage scan driving signal, the drain connects to the reference low level signal; the source of the second pull-down transistor connects to the gate control signal, the gate receives the latter two-stage scan driving signal, the drain connects to the reference low level signal.

Wherein, the pull-low holding part includes a first transistor, a second transistor, a third transistor, a fourth transistor, a fifth transistor and a sixth transistor; the gate and source of the first transistor is connect and receive the reference high level signal, the drain connects the source of the second transistor; the gate of the second transistor connects to the gate control signal, the drain connects to the reference low level signal; the source of the third transistor connects to the source of the first transistor, the gate connects to the drain of the first transistor, the drain connects to the source of the fourth transistor; the gate of the fourth transistor connects to the gate control signal, the drain connects to the reference low level signal; the source of the fifth transistor connects to the gate control signal, the gate connects to the drain of the third transistor, the drain connects to the reference low level signal; the source of the sixth transistor connects to the local level scan driving signal, the gate connects to the drain of the third transistor, the drain connects to the reference low level signal.

The present disclosure further provides a liquid crystal display device including a GOA gate driving circuit as described above.

The GOA gate driving circuit provided in the embodiment of the present disclosure adds a second pull-down part in each GOA driving unit, and the second pull-down part is controlled by a pull-down signal for pulling down the gate control signal to a reference low level signal. Wherein the pull-down signal is provided by a control chip other than the cascade-connected plurality of GOA driving units, and when the GOA gate driving circuit performs the cutting at any number of GOA driving units, the first pull-down part of the partial GOA driving unit is disabled, then the second pull-down part can make the part of the GOA driving unit can still maintain normal working conditions, thus meeting the GOA gate driving circuit can be cut in any number of series requirements. The display device including the GOA gate driving circuit as described above has a greater degree of freedom in cutting size when cutting into a small-sized display screen.

DETAILED DESCRIPTION OF PREFERRED EMBODIMENTS

Figure 1:
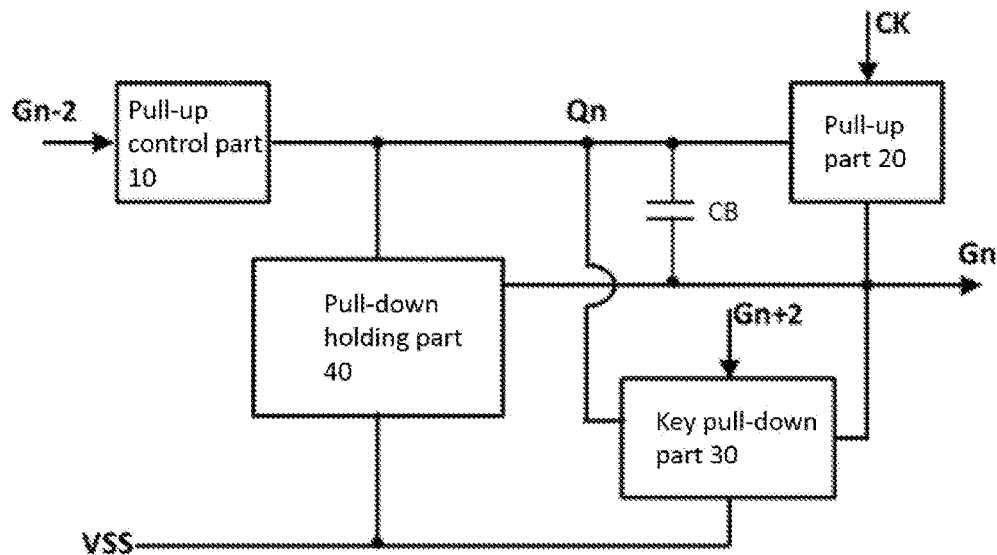
FIG. 1 is a block diagram of the structure of the GOA driving unit in a conventional GOA gate driving circuit.

For the purposes, technical solutions, and advantages of the present disclosure will become more apparent below with reference to the specific embodiments of the present disclosure will be described in detail. Examples of such preferred embodiments have been illustrated in the accompanying drawings. As shown in the drawings according to an embodiment of the present disclosure and the accompanying drawings described are only exemplary, and the present disclosure is not limited to these embodiments.

Here, it should be noted that, in order to avoid unnecessary detail obscure the present disclosure, in the drawings only shows a structure and/or processing steps according to the present disclosure are closely related, and omitted other details of the present disclosure has little relationship.

Figure 2:
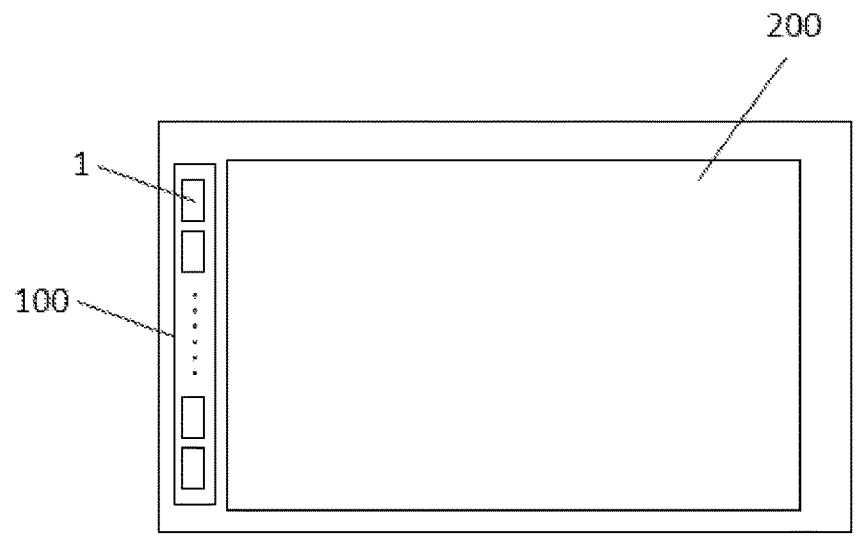
FIG. 2 is a schematic structural view of a liquid crystal display of the embodiment of the present disclosure.

The present embodiment provides a liquid crystal display, as shown in FIG. 2, the liquid crystal display includes a display area 200 and a GOA gate driving circuit 100 integrated on an edge of the display area 200, the GOA gate driving circuit 100 includes a plurality of GOA driving units 1 cascaded, the scanning driving signal is supplied to the n-th horizontal scanning line in the display area 200 controlled by the n-th stage GOA driving unit 1.

In the present embodiment, in order to make the liquid crystal display device easy to cut for the splicing screen, the GOA gate driving circuit 100 is designed to be capable of cutting in any number of stages of the GOA driving unit 1, Cutting the formation of the various parts of the gate driving circuit can work properly.

Figure 3:
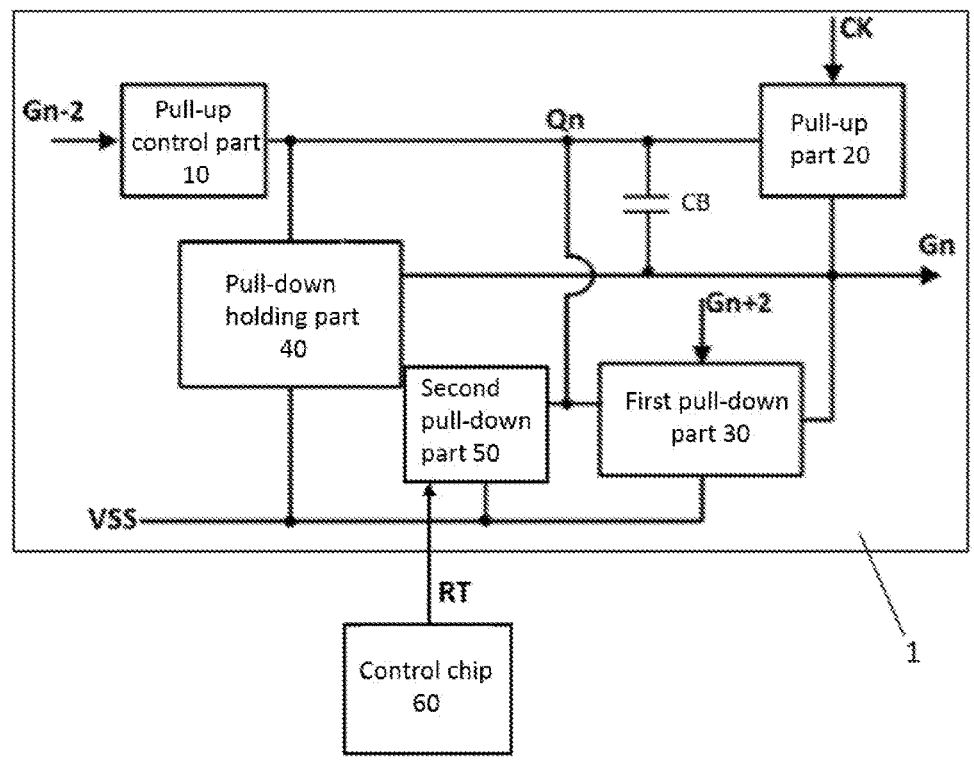
FIG. 3 is a block diagram of the structure of the GOA driving unit in the GOA gate driving circuit of the embodiment of the present disclosure.

In order to meet the requirement that the GOA driving unit can be cut in any number of stages, the present embodiment provides a GOA gate driving circuit 100 including a plurality of GOA driving units 1 arranged in cascade. As shown in FIG. 3, each GOA driving unit 1 includes a pull-up control part 10, a pull-up part 20, a first pull-down part 30, a capacitor boast CB, a pull-down holding part 40 and a second pull-down part 50.

To describe the present embodiment in detail, the following will be described using a GOA circuit with 4 CK input signals.

Wherein, the pull-up control part 10 controls the generation of the gate control signal $Q_n$ according to the first two stages scan driving signal $G_{n-2}$. The pull-up part 20 is controlled by the gate control signal $Q_n$ to converts the received scan clock signal CK into output of the local level scan driving signal $G_n$. The first pull-down part 30 controls to lower the gate control signal $Q_n$ and the local-level scan driving signal $G_n$ to a reference low level signal VSS according to the latter two-stage scan driving signal $G_{n+2}$. The capacitor boast CB is connected between an output of the pull-up control part 10 and an output of the pull-up part 20. The pull-down holding part 40 is coupled between the gate control signal $Q_n$ and the local level scan driving signal $G_n$ and the reference low level signal VSS, the pull-down holding part 40 pulls the gate control signal $Q_n$ and the local-stage scanning driving signal $G_n$ down to a reference low-level signal VSS when the scanning driving signal $G_n$ of the stage is in the non-driving time.

Figure 5:
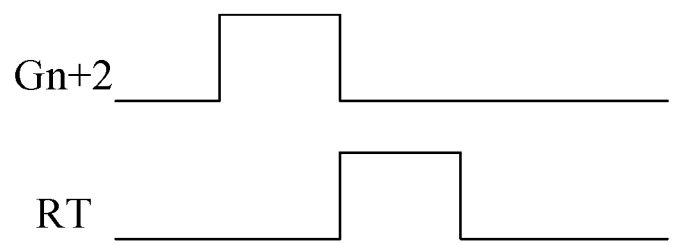
FIG. 5 is a timing diagram illustrating the pull-down signal RT and the latter two-stage scan driving signal Gn+2.

Wherein, the second pull-down part 50 is coupled between the gate control signal Qn and the reference low level signal VSS, the second pull-down part 30 is controlled by the pull-down signal RT for pulling down the gate control signal Qn to the reference low level signal VSS; the pull-down signal RT is a signal which is the same as the waveform of the latter two-stage scan driving signal Gn+2 but has a phase lag, for example, as shown in FIG. 5, the pull-down signal RT is lagged from Gn+2 until it is identical to the latter three-stage scan driving signal Gn+3, and the pull-down signal RT is provided by a separate control chip 60. Note that, in the present embodiment, the second pull-down part 50 is different from the first pull-down part 30 in that the first pull-down part 30 pulls down the gate control signal Qn and the local-stage scan driving signal Gn at the same time for the first time (The latter two-stage scan driving signal Gn+2 is at high level); and the second pull-down part 50 controls only the pull-down gate control signal Qn at the first time (the pull-down signal RT is at a high level), the pull-down gate control signal Qn turns off the pull-up part 20, the output of the local level scan driving signal Gn can be turned off. Of course, in other embodiments, the second pull-down part 50 may also be designed to pull down the gate control signal Qn and the local level scan driving signal Gn simultaneously at the first time. In the GOA driving unit 1 of the same stage, the lower two-stage scanning driving signal Gn+2 is provided by the GOA driving unit of the latter two stages in comparison with the latter two-stage scan driving signal Gn+2, and the pull-down signal RT is supplied from a control chip 60 other than a plurality of cascade GOA driving units whose phase is usually lagging behind the phase of the latter two stages of the scan driving signal Gn+2, the specific phase and pulse width may be adjusted according to actual needs. The control chip 60 may be, for example, a timing control chip (Tcon).

The GOA gate driving circuit as provided above is provided with a second pull-down part in each GOA driving unit and a second pull-down part controlled by a pull-down signal for pulling down the gate control signal to a reference low level signal. Wherein the pull-down signal is provided by a control chip other than the cascade-connected plurality of GOA driving units, and when the GOA gate driving circuit performs the cutting at any number of GOA driving units, the first pull-down part of the partial GOA driving unit (E.g., the last stage GOA driving unit of each part after cutting) is disabled, then the second pull-down part can make the part of the GOA driving unit can still maintain normal working conditions, thus meeting the GOA gate driving circuit can be cut in any number of series requirements.

In addition, since the pull-down signal RT lags behind the latter two-stage scan driving signal $G_{n+2}$, in the GOA driving unit in which the first pull-down part 30 holds the normal operation (I.e., having the latter two stages of the scan driving signal $G_{n+2}$), the second pull-down part 50 may pull down the gate control signal $Q_n$ twice to improve the stability of the GOA circuit output.

Figure 4:
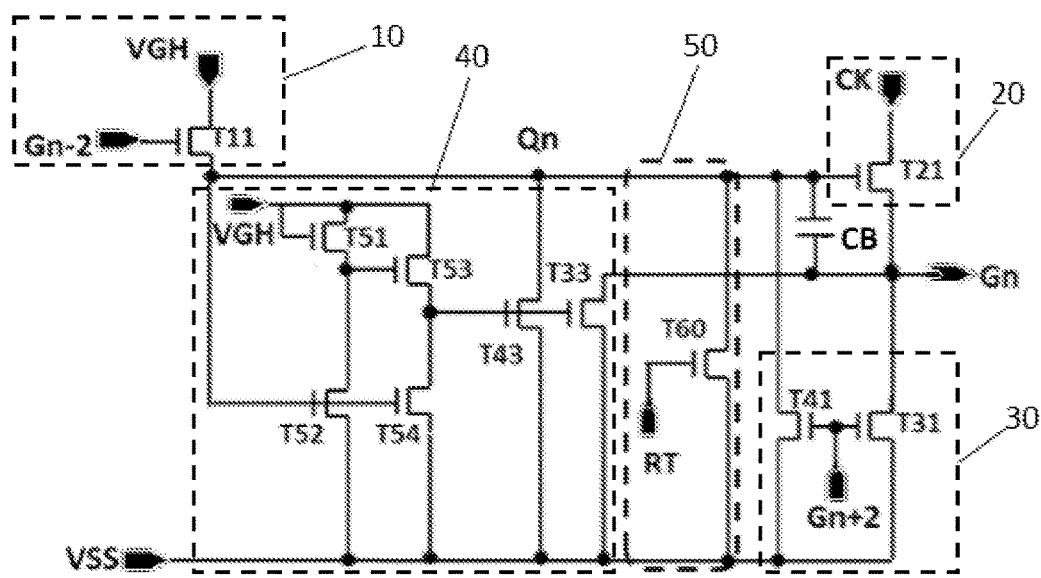
FIG. 4 is a circuit diagram of the GOA driving unit in the embodiment of the present disclosure.

Specifically, the pull-up control part 10 generates a gate control signal $Q_n$ by the first two-stage scanning driving signal $G_{n-2}$ generated by the first two stages driving unit. The gate control signal $Q_n$ is responsible for the correct operation timing of the entire GOA driving unit 1. When the line scan goes to the GOA driving unit 1 of this stage, $Q_n$ is high level, and can be used to turn on the pull-up part 20 to output this stage scan driving signal $G_n$. When the driving unit in the non-line-scan state, the need to ensure that $Q_n$ is a reliable low, so that the pull-up part 20 does not output (that is, $G_n$ is low). Therefore, in the GOA driving unit and drive circuit design, must ensure that the timing of $Q_n$ is correct. In the present embodiment, as shown in FIG. 4, the pull-up control part 10 includes a pull-up control transistor T11, the source of the pull-up control transistor T11 receives the reference high level signal VGH, the gate receives the first two-stage scan driving signal $G_{n-2}$ and the drain outputs the gate control signal $Q_n$.

In particular, the pull-up part 20 is mainly responsible for outputting the scan clock signal CK as the gate driving signal $G_n$. In the present embodiment, as shown in FIG. 4, the pull-up part 20 includes a pull-up transistor T21, the gate of the pull-up transistor T21 as the input of the control signal of the pull-up part 20 connects to the gate control signal $Q_n$, the source connects the scan clock signal CK, the drain outputs the scan driving signal $G_n$ and connects to the corresponding scanning line (not shown).

Specifically, the first pull-down part 30 serves to pull the drain potential and the gate potential of the pull-up transistor T21 low for a first time, i.e., to turn off the scan driving signal $G_n$. In the present embodiment, as shown in FIG. 4, the first pull-down part 30 includes a first pull-down transistor T31 and a second pull-down transistor T41. Wherein, the source of the first pull-down transistor T31 connects to the local level scan driving signal $G_n$, the gate receives the latter two stages scan driving signal $G_{n+2}$, the drain connects to the reference low level signal VSS, when the latter two stages scan driving signal $G_{n+2}$ is at high level, the first pull-down transistor T31 pulls the scan driving signal $G_n$ to the reference low level signal VSS, turning off the local level scan driving signal $G_n$. The source of the second pull-down transistor T41 connects to the gate control signal $Q_n$, the gate receives the latter two stages scan driving signal $G_{n+2}$, the drain connects to the reference low level signal VSS; when the latter two stages scan driving signal $G_{n+2}$ is at high level, the second pull-down transistor T41 pulls the gate control signal $Q_n$ to the reference low level signal VSS, turning off the gate control signal $Q_n$.

Specifically, the second pull-down part 50 is mainly used to pull down the gate potential (i.e., the gate control signal $Q_n$) of the pull-up transistor T21 to a low level at the first time. The second pull-down part 50 may ensure that the GOA driving unit of the stage remains in a normal operating state when the first pull-down part 30 fails; of course, if the first pull-down part 30 is in the active operating state, the second pull-down part 50 may ensure that the gate control signal $Q_n$ is pulled low to a low level, facilitating the stability of the GOA driving unit output. In the present embodiment, as shown in FIG. 4, the second pull-down part 50 includes a third pull-down transistor T60, the source of the third transistor T60 connects to the gate control signal $Q_n$, the gate connects to the pull-down signal RT, the drain connects to the reference low level signal VSS.

Wherein, as shown in FIG. 4, the capacitor boast CB connects between the output of the pull-up control part 10 and the output of the pull-up part 20, that is, both ends of the capacitor boast CB respectively connect the gate control signal $Q_n$ and the local level scan driving signal $G_n$, the capacitor boast CB serves to store the voltage at the gate terminal of the pull-up transistor T21 when $Q_n$ is at a high level, when $G_n$ outputs a high level line scan signal, the capacitor boast CB can double up the potential of the gate of the pull-up transistor T21 to ensure that the pull-up transistor T21 is reliably turned on and the output scan driving signal $G_n$ is turned on. After the completion of this stage of the scan driving, $G_n$ is low, and the other line scan time has maintained this low.

The first pull-down part 30 will not be able to maintain a low level of $Q_n$ and $G_n$ after the latter two-stage scan driving signal $G_{n+2}$ received by the first pull-down part 30 returns to the low level, and therefore, in the GOA driving unit 1, the $Q_n$ and $G_n$ are held in the off state (low level state) by the pull-down holding unit 40. In the present embodiment, specifically, as shown in FIG. 4, the pull-down holding circuit 40 includes a first transistor T51, a second transistor T52, a third transistor T53, a fourth transistor T54, a fifth transistor T43 and a sixth transistor T33. Wherein, the gate and source of the first transistor T51 connects and receives the reference high level signal VGH, the drain connects to the source of the second transistor T52; the gate of the second transistor T52 connects to the gate control signal $Q_n$, the drain connects to the reference low level signal VSS; the source of the third transistor T53 is connected with the source of the first transistor T51, the gate is connected with the drain of the first transistor T51, the drain is connected with the source of the fourth transistor T54; the gate of the fourth transistor T54 connects to the gate control signal $Q_n$, the drain connects to the reference low level signal VSS; the source of the fifth transistor T43 connects to the gate control signal $Q_n$, the gate is connected with the drain of the third transistor T53, the drain connects to the reference low level signal VSS; the source of the sixth transistor T33 connects to the local level scan driving signal $G_n$, the gate is connected with the drain of the third transistor T53, the drain connects to the reference low level signal VSS.

Refer to FIG. 4, in the pull-down holding circuit 40: (1). Before the local level GOA driving unit open scanning, $Q_n$ is low level, the second transistor T52 and the fourth transistor T54 are turned off, the first transistor T51 and the third transistor T53 are turned on, the fifth transistor T43 and the sixth transistor T33 are turned on, the gate control signal $Q_n$ and the local level scan driving signal $G_n$ are connected to the reference low level signal VSS, $Q_n$ and $G_n$ are maintained in the off-state. (2). When the GOA driving unit of this stage performs scan driving, $Q_n$ is high, the second transistor T52 and the fourth transistor T54 are turned on, the third transistor T53 is turned off, the fifth transistor T43 and the sixth transistor T33 are also turned off, the control signal $Q_n$, and the local level scan driving signal $G_n$ and the reference low-level signal VSS are turned off, and $Q_n$ and $G_n$ are both at high level. (3). After the scanning of the GOA driving unit at this stage is completed, first, as previously described, the first pull-down part 30 pulls $Q_n$ and $G_n$ low for the first time, and when $Q_n$ is pulled low, it is possible to maintain the $Q_n$ and $G_n$ in the off-state of the low level by the pull-down holding circuit 40 as described in the point (1).

As described above, the GOA gate driving circuit and the corresponding liquid crystal display device as described in the above embodiment are provided with a second pull-down part in each GOA driving unit and a second pull-down part controlled by a pull-down signal for pulling down the gate control signal to the reference low level signal. Wherein, the pull-down signal is provided by a control chip other than the cascade-connected plurality of GOA driving units. When the GOA gate driving circuit is cut by any number of GOA driving units to cause the first pull-down part of the partial GOA driving unit to fail, at this time, the second pull-down part can make the GOA driving unit of the part still maintain the normal working state, thus satisfying the requirement that the GOA gate driving circuit can cut in any number of stages. The display device including the GOA gate driving circuit as described above has a greater degree of freedom in cutting size when cutting into a small-sized display screen.

It should be noted that in this context relational terms such as first and second are used merely to distinguish one entity or operation from another entity or operation without necessarily requiring or implying that such entity or operation between any such actual relationship or order. The term "including", "including" or any other variation thereof are intended to cover a non-exclusive inclusion, such that a series of factors including the process, method, article, or apparatus includes not only these elements but also other elements not explicitly listed, or further includes such process, method, article or device inherent feature. Without more constraints, by the statement "includes a" defining element does not exclude the presence of other elements including the same elements process, method, article or device.

The above description is only a specific embodiment of the present application, it should be noted that those of ordinary skill in the art, in the present application without departing from the principles of the premise, but also a number of improvements and modifications can be made, these improvements and modifications are to be considered the scope of the present application.

What is claimed is:

1. A GOA gate driving circuit comprises a plurality of GOA driving units arranged in cascade, each level GOA driving unit comprises a pull-up control part, a pull-up part, a first pull-down part and a pull-down holding part; the pull-up control part controls the generation of a gate control signal according to a first two-stage scan driving signal; the pull-up part is controlled by the gate control signal, and converts a scan clock signal into output of a local level scan driving signal; the first pull-down part controls to lower the gate control signal and the local level scan driving signal to a reference low level signal according to a latter two-stage scan driving signal; the pull-down holding part is coupled between the gate control signal and the local level scan driving signal and the reference low level signal for lowing the gate control signal and the local level scan driving signal to the reference low level signal; wherein, each stage GOA driving unit further comprises a second pull-down part coupled between the gate control signal and the reference low level signal, the second pull-down part being controlled by a pull-down signal for lowering the gate control signal to the reference low level signal; the phase of the pull-down signal lags behind the latter two-stage scan driving signal, and the pull-down signal is provided by a separate control chip, wherein the waveform of the pull-down signal is a signal which is the same as the waveform of the latter two-stage scan driving signal and has a phase lag such that the pull-down signal is identical to a latter three-stage scan driving signal.

2. The GOA gate driving circuit according to claim 1, wherein, the second pull-down part comprises a third pull-down transistor having a source connected to the gate control signal, a gate connected to the pull-down signal, and a drain connected to a reference low level signal.

3. The GOA gate driving circuit according to claim 2, wherein, the independent control chip is a timing control chip.

4. The GOA gate driving circuit according to claim 2, wherein, the GOA driving unit further comprises a capacitor boost connected between an output of the pull-up control part and an output of the pull-up part.

5. The GOA gate driving circuit according to claim 2, wherein, the pull-up control part includes a pull-up control transistor, the source of the pull-up control transistor receives a reference high level signal, the gate receives the first two-stage scan driving signal and the drain outputs the gate control signal.

6. The GOA gate driving circuit according to claim 2, wherein, the pull-up part comprises a pull-up level transfer transistor, the gate of the pull-up level transfer transistor receives the gate control signal, the source connects to the scan clock signal, and the drain outputs the local level scan driving signal.

7. The GOA gate driving circuit according to claim 2, wherein, the first pull-down part comprises a first pull-down transistor and a second pull-down transistor, the source of the first pull-down transistor connects to the local level scan driving signal, the gate receives the latter two-stage scan driving signal, the drain connects to the reference low level signal; the source of the second pull-down transistor connects to the gate control signal, the gate receives the latter two-stage scan driving signal, the drain connects to the reference low level signal.

8. The GOA gate driving circuit according to claim 2, wherein, the pull-low holding part comprises a first transistor, a second transistor, a third transistor, a fourth transistor, a fifth transistor and a sixth transistor;
the gate and source of the first transistor is connect and receive a reference high level signal, the drain connects the source of the second transistor; the gate of the second transistor connects to the gate control signal, the drain connects to the reference low level signal; the source of the third transistor connects to the source of the first transistor, the gate connects to the drain of the first transistor, the drain connects to the source of the fourth transistor; the gate of the fourth transistor connects to the gate control signal, the drain connects to the reference low level signal; the source of the fifth transistor connects to the gate control signal, the gate connects to the drain of the third transistor, the drain connects to the reference low level signal; the source of the sixth transistor connects to the local level scan driving signal, the gate connects to the drain of the third transistor, the drain connects to the reference low level signal.

9. A liquid crystal display comprises a GOA gate driving circuit, the GOA gate driving circuit comprises a plurality of GOA driving units arranged in cascade, each level GOA driving unit comprises a pull-up control part, a pull-up part, a first pull-down part and a pull-down holding part; the pull-up control part controls the generation of a gate control signal according to a first two-stage scan driving signal; the pull-up part is controlled by the gate control signal, and converts a scan clock signal into output of a local level scan driving signal; the first pull-down part controls to lower the gate control signal and the local level scan driving signal to a reference low level signal according to a latter two-stage scan driving signal; the pull-down holding part is coupled between the gate control signal and the local level scan driving signal and the reference low level signal for lowing the gate control signal and the local level scan driving signal to the reference low level signal; wherein,
each stage GOA driving unit further comprises a second pull-down part coupled between the gate control signal and the reference low level signal, the second pull-down part being controlled by a pull-down signal for lowering the gate control signal to the reference low level signal; the phase of the pull-down signal lags behind the latter two-stage scan driving signal, and the pull-down signal is provided by a separate control chip, wherein the waveform of the pull-down signal is a signal which is the same as the waveform of the latter two-stage scan driving signal and has a phase lag such that the pull-down signal is identical to a latter three-stage scan driving signal.

10. The liquid crystal display according to claim 9, wherein, the second pull-down part comprises a third pull-down transistor having a source connected to the gate control signal, a gate connected to the pull-down signal, and a drain connected to a reference low level signal.

11. The liquid crystal display according to claim 10, wherein, the independent control chip is a timing control chip.

12. The liquid crystal display according to claim 10, wherein, the GOA driving unit further comprises a capacitor boast connected between an output of the pull-up control part and an output of the pull-up part.

13. The liquid crystal display according to claim 10, wherein, the pull-up control part includes a pull-up control transistor, the source of the pull-up control transistor receives a reference high level signal, the gate receives the first two-stage scan driving signal and the drain outputs the gate control signal.

14. The liquid crystal display according to claim 10, wherein, the pull-up part comprises a pull-up level transfer transistor, the gate of the pull-up level transfer transistor receives the gate control signal, the source connects to the scan clock signal, and the drain outputs the local level scan driving signal.

15. The liquid crystal display according to claim 10, wherein, the first pull-down part comprises a first pull-down transistor and a second pull-down transistor, the source of the first pull-down transistor connects to the local level scan driving signal, the gate receives the latter two-stage scan driving signal, the drain connects to the reference low level signal; the source of the second pull-down transistor connects to the gate control signal, the gate receives the latter two-stage scan driving signal, the drain connects to the reference low level signal.

16. The liquid crystal display according to claim 10, wherein, the pull-low holding part comprises a first transistor, a second transistor, a third transistor, a fourth transistor, a fifth transistor and a sixth transistor;
the gate and source of the first transistor is connect and receive a reference high level signal, the drain connects the source of the second transistor; the gate of the second transistor connects to the gate control signal, the drain connects to the reference low level signal; the source of the third transistor connects to the source of the first transistor, the gate connects to the drain of the first transistor, the drain connects to the source of the fourth transistor; the gate of the fourth transistor connects to the gate control signal, the drain connects to the reference low level signal; the source of the fifth transistor connects to the gate control signal, the gate connects to the drain of the third transistor, the drain connects to the reference low level signal; the source of the sixth transistor connects to the local level scan driving signal, the gate connects to the drain of the third transistor, the drain connects to the reference low level signal.

\* \* \* \* \*